(12) United States Patent
Cao et al.

(10) Patent No.: US 11,817,515 B2
(45) Date of Patent: Nov. 14, 2023

(54) PHOTOVOLTAIC MODULE, INTEGRATED PHOTOVOLTAIC/PHOTO-THERMAL MODULE AND MANUFACTURING METHOD THEREOF

(71) Applicant: Gree Electric Appliances, Inc. of Zhuhai, Guangdong (CN)

(72) Inventors: Wenbing Cao, Guangdong (CN); Delin Yan, Guangdong (CN); Hongming Liu, Guangdong (CN); Jiahui Lin, Guangdong (CN); Hao Wang, Guangdong (CN)

(73) Assignee: Gree Electric Appliances, Inc. of Zhuhai, Zhuhai (CN)

( * ) Notice: Subject to any disclaimer, the term of this patent is extended or adjusted under 35 U.S.C. 154(b) by 0 days.

(21) Appl. No.: 17/576,136

(22) Filed: Jan. 14, 2022

(65) Prior Publication Data
US 2022/0140167 A1 May 5, 2022

Related U.S. Application Data

(62) Division of application No. 16/080,681, filed as application No. PCT/CN2017/072031 on Jan. 22, 2017, now abandoned.

(30) Foreign Application Priority Data

Feb. 29, 2016 (CN) .......................... 201610110791.2

(51) Int. Cl.
*H01L 31/048* (2014.01)
*H01L 31/049* (2014.01)
(Continued)

(52) U.S. Cl.
CPC ........ *H01L 31/0488* (2013.01); *H01L 31/048* (2013.01); *H01L 31/049* (2014.12);
(Continued)

(58) Field of Classification Search
CPC ..... B32B 2457/12; Y02E 10/44; Y02E 10/50; Y02E 10/60; H01L 31/0481;
(Continued)

(56) References Cited

U.S. PATENT DOCUMENTS 4,210,462 A 7/1980 Tourneaux
2003/0070706 A1* 4/2003 Fujioka ................. H01L 31/048
136/251
(Continued)

FOREIGN PATENT DOCUMENTS

CN 201608190 U 10/2010
CN 102208476 A 10/2011
(Continued)

OTHER PUBLICATIONS

Translation of CN-203984350-U, Yang, Zhi-quan. (Year: 2014).*
(Continued)

*Primary Examiner* — Mayla Gonzalez Ramos
(74) *Attorney, Agent, or Firm* — McAndrews, Held & Malloy, Ltd.

(57) ABSTRACT

Disclosed are a photovoltaic module, an integrated photovoltaic/photo-thermal module and a manufacturing method thereof. The photovoltaic module includes: a front glass plate (1), a first back plate (4), an adhesive layer (3) located between the front glass plate and the first back plate, and cell sheets (5) located in the adhesive layer. At least a hollow layer (2) is included between the front glass plate and the adhesive layer. Since the photovoltaic module and the integrated photovoltaic/photo-thermal module include the hollow layer, making the integrated photovoltaic/photo-thermal module itself has a partial heat insulation function without the need to add a front glass blocking plate or a hollow heat insulation layer directly in front of the light-receiving surface of the module, thereby simplifying the structure and
(Continued)

manufacturing process of the integrated photovoltaic/photothermal module.

9 Claims, 3 Drawing Sheets

(51) Int. Cl.
    *H01L 31/054*     (2014.01)
    *H02S 30/10*     (2014.01)
    *H02S 40/44*     (2014.01)

(52) U.S. Cl.
    CPC ...... *H01L 31/0481* (2013.01); *H01L 31/0547* (2014.12); *H02S 30/10* (2014.12); *H02S 40/44* (2014.12); *Y02E 10/50* (2013.01)

(58) Field of Classification Search
    CPC . H01L 31/049; H01L 51/5253; H01L 31/048; H01L 31/0488; H01L 31/0547; H02S 40/44; H02S 30/10
    See application file for complete search history.

(56) References Cited

U.S. PATENT DOCUMENTS

| | | | | |
|---|---|---|---|---|
| 2004/0182432 | A1* | 9/2004 | Yoda | ............... H01L 31/0488 136/251 |
| 2013/0269755 | A1 | 10/2013 | Ku | |

FOREIGN PATENT DOCUMENTS

| | | | |
|---|---|---|---|
| CN | 202562085 | U | 11/2012 |
| CN | 102903769 | A | 1/2013 |
| CN | 202871808 | U | 4/2013 |
| CN | 203984350 | U * | 12/2014 |
| CN | 203984350 | U | 12/2014 |
| CN | 204787333 | U | 11/2015 |
| CN | 205016539 | U | 2/2016 |
| CN | 205039167 | U | 2/2016 |
| CN | 105552152 | A | 5/2016 |
| CN | 205406537 | U | 7/2016 |
| GB | 2463671 | A | | 3/2010 |

OTHER PUBLICATIONS

International Search Report for PCT Patent Application No. PCT/CN2017/072031 dated Apr. 16, 2017. (4 Pages).
CN application 2016101107912 first search examination report dated Dec. 20, 2016 (2 pages).
CN application 2016101107912 second search examination report dated Jul. 3, 2017 (2 pages).
Extended European search report for EP application No. 17759081.7, dated Sep. 2, 2019 (9 pages).
The Communication pursuant to Article 94(3) EPC for Application No. 17 759 081.7, dated Aug. 28, 2020, European Patent Office, Germany (6 pages).
Machine translation of CN203984350U, Yang et al., retrieved from https://worldwide.espacenet.com/ (Year 2014).
Machine translation of CN-202562085-U, Nanjing et al. (Year: 2012).
Communication pursuant to Article 94(3) EPC for European Application No. 17 759 081.7-1230, dated Jun. 15, 2021, European Patent Office, Germany (8 pages).

* cited by examiner

PHOTOVOLTAIC MODULE, INTEGRATED PHOTOVOLTAIC/PHOTO-THERMAL MODULE AND MANUFACTURING METHOD THEREOF

The present application is a divisional application of U.S. application Ser. No. 16/080,681, filed to the US Patent Office, on Aug. 29, 2018, entitled "Photovoltaic module, Integrated Photovoltaic/Photo-thermal module and Manufacturing Method thereof", and claims priority of China Patent Application No. 201610110791.2, filed on Feb. 29, 2016 and entitled 'Photovoltaic module, integrated photovoltaic/photo-thermal module and manufacturing method thereof', the contents of which are hereby incorporated by reference in its entirety.

TECHNICAL FIELD

Embodiments of the present disclosure relates to a field of solar photovoltaic and thermal, and in particular to a solar photovoltaic module with a hollow structure, an integrated photovoltaic/photo-thermal module and a manufacturing method thereof.

BACKGROUND

Along with the continuous development of the industry, the consumption of energy is increased day by day, so people start to focus on the development of new energy sources. Solar energy is used as a green energy resource, which is a renewable energy source with the most development potential on the earth undoubtedly. According to the different energy conversion modes, the application of the solar energy may be divided to two types of photovoltaic and photo-thermal. 'Photovoltaic' is a mode of directly converting optical energy to electric energy by using a photovoltaic effect of a semiconductor interface, and 'photo-thermal' is a mode of absorbing optical energy with different wave lengths in a solar radiation spectrum by using a material and conveying the optical energy to thermal energy.

Generally, the utilization ratio of the 'photovoltaic' mode to the solar energy is less than 20%, and the most of the rest energy is converted to the thermal energy, one part is emitted to the air, and the other part is stored in a battery so as to cause the temperature increment of the battery. So the integrated photovoltaic/photo-thermal module is constructed for integrating two types of the 'photovoltaic' and 'photo-thermal' modes, thereby collecting the above heat effectively, and improving the comprehensive utilization efficiency of the solar energy.

Now, a current photovoltaic/photo-thermal integrated technology is generally that a thermal collecting assembly is additionally installed on the back of a conventional semi-finished photovoltaic module, and the thermal insulation is performed on the whole integrated module. The thermal insulation method is generally that a front glass blocking plate and an air layer are installed in front of the integrated module. A sectional schematic diagram of a current conventional semi-finished photovoltaic module is as shown in FIG. 1. From top to bottom, the conventional semi-finished photovoltaic module successively includes: a front glass plate 11, an Ethylene-vinyl acetate (EVA) filling layer 12 and a Tedlar/PET/Tedlar (TPT) back plate 13, wherein cell sheets 14 are clamped between the front glass plate 11 and the TPT back plate 13, and the front glass plate 11, the cell sheets 14 and the TPT back plate 13 are adhered together by the EVA filling layer.

Typically, the structure of the integrated photovoltaic/photo-thermal module including the above semi-finished photovoltaic module is as shown in FIG. 2, below the conventional semi-finished photovoltaic module as shown in FIG. 1, namely at a lower side of the TPT back plate 13, a thermal conducting back plate 17 is installed, specifically, the thermal conducting back plate 17 is adhered with the TPT back plate 13 by using the EVA. A lower side of the thermal conducting back plate 17 is welded with a thermal conducting copper pipe 18, so the heat of the thermal conducting back plate 17 is transmitted to the outside for storing. A lower part of the thermal conducting copper pipe 18 and two sides of each of the above components are filled with a thermal insulation material 19. Further, above the conventional semi-finished photovoltaic module as shown in FIG. 1, namely above the front glass plate 11, an air layer 16 is reserved as a thermal insulation layer, and a front glass blocking plate 15 is installed above the air layer 16. Finally, a periphery of each of the above parts is packaged by using an aluminum frame K.

In the structure of the integrated photovoltaic/photo-thermal module as shown in FIG. 2, light penetrates the front glass blocking plate 15 from the upward side of the integrated module, passes through the air layer 16, and reaches the front glass plate 11 of the conventional semi-finished photovoltaic module as shown in FIG. 1, and then irradiates the cell sheets 14. So, in the integrated photovoltaic/photo-thermal module formed by the above manner, although the thermal insulation effect is achieved so as to improve the thermal efficiency, it is observed from the structure as shown in FIG. 2 that because the air layer and one piece of front glass blocking plate 15 are additionally installed on the front glass plate 11 of the photovoltaic module, the penetration rate is reduced while the light penetrates the front glass blocking plate 15 and the air layer 16, namely the more light decay is caused, thereby the photovoltaic conversion efficiency is reduced.

In addition, because the front glass blocking plate 15 and the air layer 16 are additionally installed, the structure of the integrated photovoltaic/photo-thermal module is complicated, and a manufacturing process is tedious and inefficient.

SUMMARY

Embodiments of the present disclosure are provided in allusion to the above problems existing in the prior art, namely a photovoltaic module, an integrated photovoltaic/photo-thermal module and a manufacturing method thereof are provided, thereby the thermal insulation effect of the integrated photovoltaic/photo-thermal module can be guaranteed, and meanwhile the structure and the manufacturing process of the integrated photovoltaic/photo-thermal module are simplified. Specifically, preferred schemes of the disclosure can reduce the refractive index change of the light in a transmission route of the assembly, and increase the light transmissivity.

According to a first aspect of the disclosure, a photovoltaic module is provided, including: a front glass plate, a first back plate, an adhesive layer provided between the front glass plate and the first back plate, and a cell sheet provided in the adhesive layer, wherein at least a hollow layer is provided between the front glass plate and the adhesive layer.

In at least one alternative embodiment, the hollow layer is vacuum or filled with nitrogen.

In at least one alternative embodiment, a second glass is further provided between the front glass plate and the adhesive layer, the second glass contacts with the adhesive layer, and two sides of the hollow layer are the front glass plate and the second glass respectively.

In at least one alternative embodiment, a vacuum glass assembly is formed by the front glass plate and the second glass.

In at least one alternative embodiment, the photovoltaic module further includes a support structure, wherein the front glass plate is supported on the support structure, such that the front glass plate is separated from the adhesive layer in a determined distance so as to form the hollow layer.

In at least one alternative embodiment, the support structure is supported on the first back plate; or the photovoltaic module further includes a second back plate provided at the bottom side of the first back plate, and the support structure is supported on the second back plate.

According to a second aspect of the disclosure, an integrated photovoltaic/photo-thermal module is provided, the integrated photovoltaic/photo-thermal module includes:
 the above photovoltaic module; and
 a thermal collecting assembly, wherein the thermal collecting assembly is used for covering the photovoltaic module at a bottom part and a side part.

In at least one alternative embodiment, the thermal collecting assembly includes: a thermal collecting plate provided at the bottom side of the photovoltaic module, a heat exchanger contacting with the thermal collecting plate, and a thermal insulation material which is used for realizing a covering function at the bottom part and the side part; or
 in the case of the presence of a second back plate, the second back plate is used as the thermal collecting plate, and the thermal collecting assembly includes: a heat exchanger contacting with the second back plate, and a thermal insulation material which is used for realizing a covering function at a bottom part and a side part.

In at least one alternative embodiment, the integrated photovoltaic/photo-thermal module further includes: a frame, wherein the frame covers the outer side of the thermal insulation material.

In at least one alternative embodiment, the heat exchanger is fixed below the thermal collecting plate, and/or, the heat exchanger is a thermal-conducting copper pipe.

According to a third aspect of the disclosure, a manufacturing method for the photovoltaic module is provided, which includes:
 a first back plate is installed;
 an adhesive layer and a cell sheet are installed on the first back plate, and the cell sheets are made to be provided in the adhesive layer; and
 a front glass plate are installed above the adhesive layer, such that at least a hollow layer is provided between the front glass plate and the adhesive layer.

In at least one alternative embodiment, the step of installing the front glass plate above the adhesive layer includes:
 a vacuum glass assembly is laid on the adhesive layer, such that the front glass plate is formed by an outer layer glass of the vacuum glass assembly; or
 a support structure is installed, and the front glass plate is placed on the support structure, such that the front glass plate is separated from the adhesive layer in a determined distance so as to form the hollow layer.

In at least one alternative embodiment, the step of installing the support structure includes:
 the support structure is made to be supported on the first back plate; or the support structure is made to be supported on the second back plate, wherein the second back plate is installed before the step of installing the first back plate, and the first back plate is provided on the second back plate; or
 before the first back plate is installed, the second back plate with the support structure is firstly installed, and the first back plate is installed on the second back plate.

According to a fourth aspect of the disclosure, a manufacturing method for the integrated photovoltaic/photo-thermal module is provided, which includes:
 the above photovoltaic module is provided;
 a thermal collecting assembly is formed at the bottom part and the side part of the photovoltaic module.

In at least one alternative embodiment, the step of forming a thermal collecting assembly includes:
 a thermal collecting plate is installed at the bottom part of the photovoltaic module, or in the case of the presence of a second back plate, the second back plate is made to be used as the thermal collecting plate;
 a heat exchanger is installed at the lower side of the thermal collecting plate; and
 the lower side of the heat exchanger and the side part of the photovoltaic module is covered with a thermal insulation material.

In at least one alternative embodiment, the method further includes: a frame is covered at the outer side of the thermal collecting assembly.

According to a fifth aspect of the disclosure, a manufacturing method for the integrated photovoltaic/photo-thermal module is provided, which includes:
 a second back plate with a support structure is provided, and a first back plate, an adhesive layer and a cell sheet are successively laid on the second back plate for laminating;
 the front glass plate are placed on the support structure, such that the front glass plate is separated from the adhesive layer in a determined distance so as to form a hollow layer, to obtain the photovoltaic module with the hollow layer;
 a heat exchanger is installed at the lower side of the second back plate; and
 the lower side of the heat exchanger and the side part of the photovoltaic module is covered with a thermal insulation material.

According to the photovoltaic module and the integrated photovoltaic/photo-thermal module of the disclosure, the hollow layer is applied to the photovoltaic module and the photovoltaic/photo-thermal module, so the integrated photovoltaic/photo-thermal module itself has a partial heat insulation function without the need to add a front glass blocking plate and a hollow heat insulation layer directly in front of the light-receiving surface of the module, thereby simplifying the structure and manufacturing process of the integrated photovoltaic/photo-thermal module. In addition, compared with the photovoltaic/photo-thermal module in the related art, because a layer of the front glass blocking plate is reduced, and two times of the refractive index changes are reduced, the light transmissivity is improved, thereby the conversion efficiency is further improved, and the production cost of products is reduced.

The technical schemes of the disclosure are further described in detail with reference to the accompanying drawings and the detailed description of the embodiments below, and the beneficial effect of the disclosure is further clarified.

BRIEF DESCRIPTION OF THE DRAWINGS

The illustrated drawings herein are used for providing further understanding to the disclosure, and form a part of the disclosure, which are used for explaining the disclosure, and are not intended to limit the disclosure.

DETAILED DESCRIPTION OF THE EMBODIMENTS

In order to make the purpose, the technical schemes and the advantages of the disclosure clearer, the disclosure will further be described below in combination with the drawings and embodiments in detail. Apparently, the described embodiments are merely one part of the embodiments of the disclosure, but are not all of the embodiments. Based on the embodiments of the disclosure, all other embodiments obtained by those skilled in the art in the precondition without the creative work shall fall within the protection scope of the disclosure.

In addition, it should be noted that words of location, such as 'above' and 'below', in the context of the disclosure are merely used for conveniently describing, and expressing the relative positions while explained according to the arrangement manners as shown in the figures, and do not mean the absolute position relation.

Figure 1:
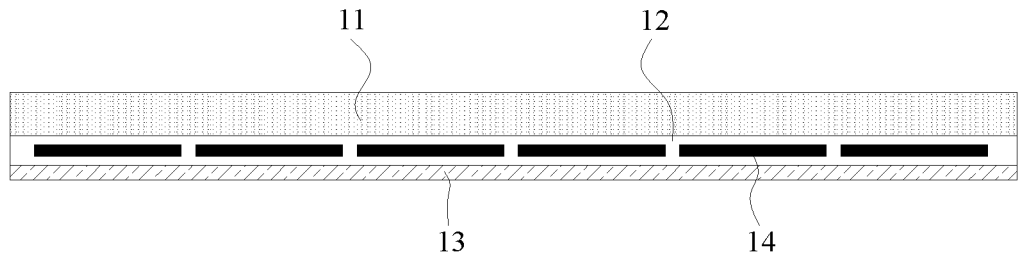
FIG. 1 is a sectional structure diagram of a current conventional semi-finished photovoltaic module.
Figure 2:
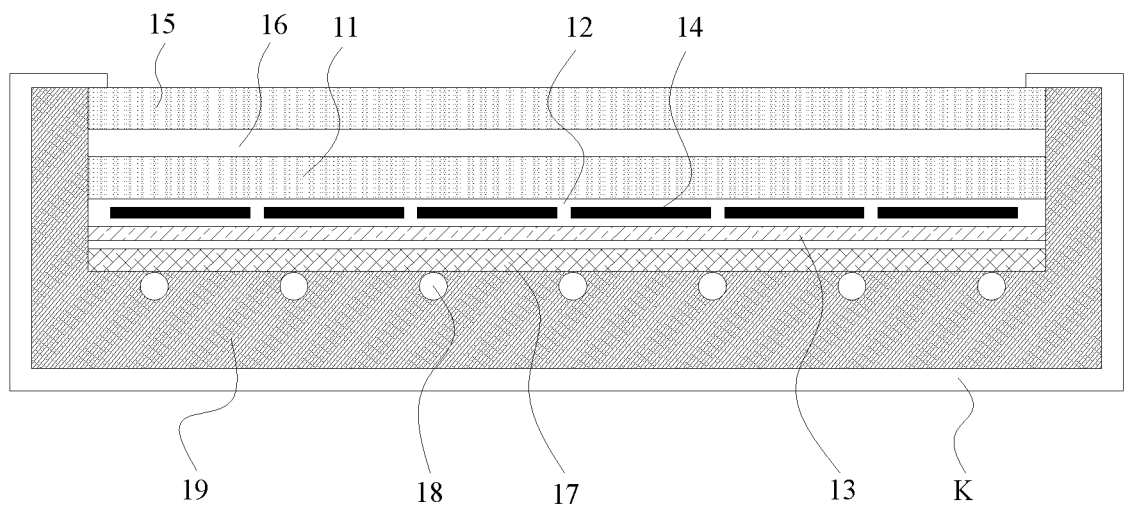
FIG. 2 is a sectional structure diagram of an integrated photovoltaic/photo-thermal module manufactured by using the semi-finished photovoltaic module as shown in FIG. 1.

According to the technical conception of the disclosure, for the structure of the conventional semi-finished photovoltaic module as shown in FIG. 1, it should be considered that a hollow layer is additionally installed in the photovoltaic module so as to achieve a thermal insulation function. Specifically, a hollow layer may be installed between the EVA filling layer and the front glass plate, such that the formed photovoltaic module itself has a thermal insulation function without the need to add a front glass blocking plate and a hollow heat insulation layer directly in the integrated photovoltaic/photo-thermal module formed by using the photovoltaic module to achieve the thermal insulation effect. At the same time, because a layer of the front glass blocking plate is reduced, the light transmissivity can be guaranteed, thereby improving the conversion efficiency, and reducing the production cost.

Figure 3:
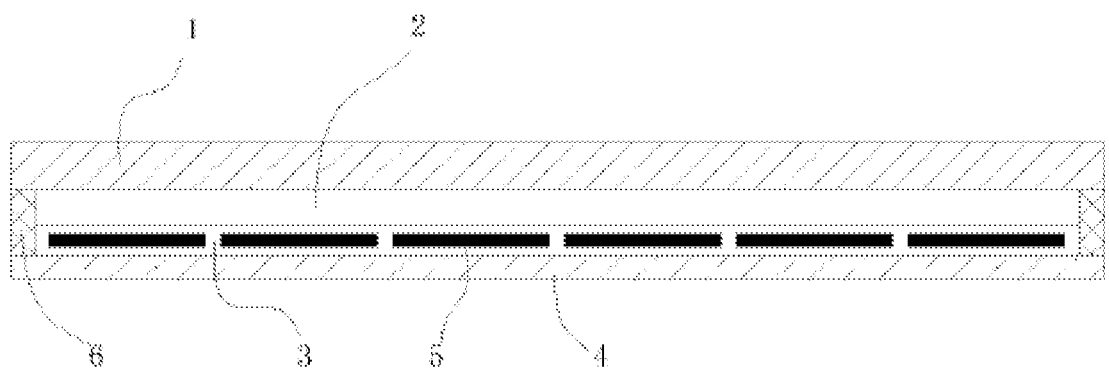
FIG. 3 is a sectional structure diagram of the photovoltaic module according to a preferred embodiment of the disclosure.

Firstly, the photovoltaic module (namely semi-finished photovoltaic module) according to a preferred embodiment of the disclosure is described in combination with FIG. 3. As shown in FIG. 3, the photovoltaic module includes a front glass plate 1, a hollow layer 2, an adhesive layer 3, a first back plate 4 and a support structure 6, wherein the support structure 6 is used for supporting the front glass plate 1, such that the hollow layer 2 is formed between the adhesive layer 3 and the front glass plate 1, and a cell sheet 5 is adhered to the first back plate 4 by using the adhesive layer 3.

The above front glass plate 1, which may be made of tempered glass for example, is good in light transmission, and has a certain intensity, thus achieving a necessary protection function. The support structure 6 is used for supporting the front glass plate 1, in an embodiment, the support structure 6 is installed at the two end positions between the first back plate 4 and the front glass plate 1 or the whole peripheral position, such that the hollow layer may be formed between the adhesive layer 3 and the front glass plate 1. So, in an aspect of the material selection, the first back plate needs to be selected from materials with the mechanical strength, so as to achieve the support to the support structure 6. The support structure may not be limited to the manner, only if a necessary hollow layer may be formed between the front glass plate 1 and the adhesive layer 3. In another embodiment, the support structure may also be installed at the two end positions between the adhesive layer 3 and the front glass plate 1 or the whole peripheral position, at this moment, the height of the support structure 6 is equal to the thickness of the hollow layer 2.

Figure 5:
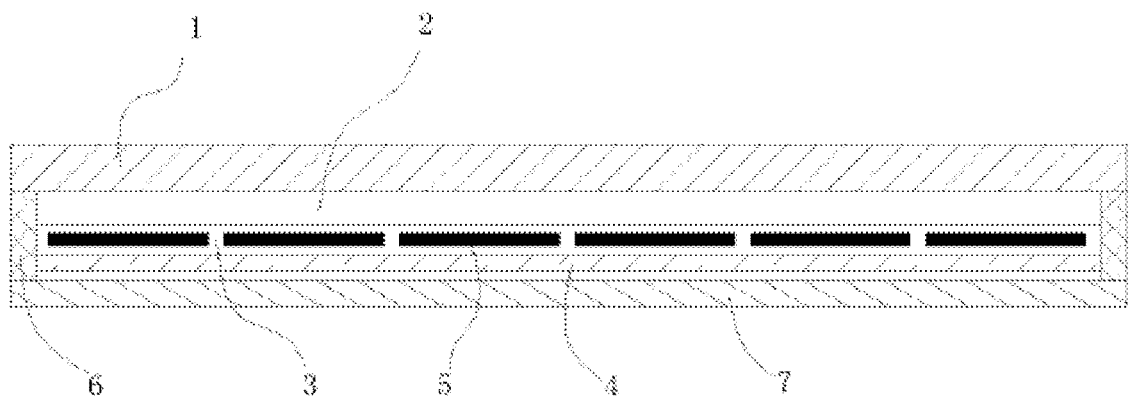
FIG. 5 is a sectional structure diagram of the photovoltaic module according to another preferred embodiment of the disclosure.

Specifically, as shown in FIG. 5, the photovoltaic module further includes a second back plate 7 (as a semi-finished product of the photovoltaic/photo-thermal module, the second back plate 7 may be specifically used as a thermal collecting plate or a thermal-conducting plate simultaneously), in another embodiment, the support structure 6 may also be formed on the second back plate (namely the thermal collecting plate or the thermal-conducting plate), or the second back plate with the support structure (namely the second back plate and the support structure are a whole structure or an integrated structure) may be used. The thermal collecting plate (or named as the thermal-conducting plate) will be further described below.

The adhesive layer 3 is a photovoltaic cell packaging adhesive layer, in at least one alternative embodiment, the adhesive layer 3 is formed by an EVA material with good adhesive force, durability and optical properties and the like. Of course, the disclosure is not limited to this, and a PVB may also be used for forming the adhesive layer. The hollow layer 2 is a vacuum layer in at least one alternative embodiment, or a gas layer filled with nitrogen or inert gases and the like. The back plate 4 is a TPT back plate in at least one alternative embodiment. Of course, the disclosure is not limited to this, and the back plate 4 may also be a Tedlar/PET/EVA (TPE) back plate or a FPF back plate. The support structure 6 uses a material with the strength by which the front glass plate 1 may be supported, for example, an aluminum alloy, and engineering plastics with high mechanical strength (ABS plastics). In addition, in order to improve the leakproofness of the hollow layer, each connecting surface (between the front glass plate 1 and the support structure 6) may be sealed by using sealing silica gel.

Figure 4:
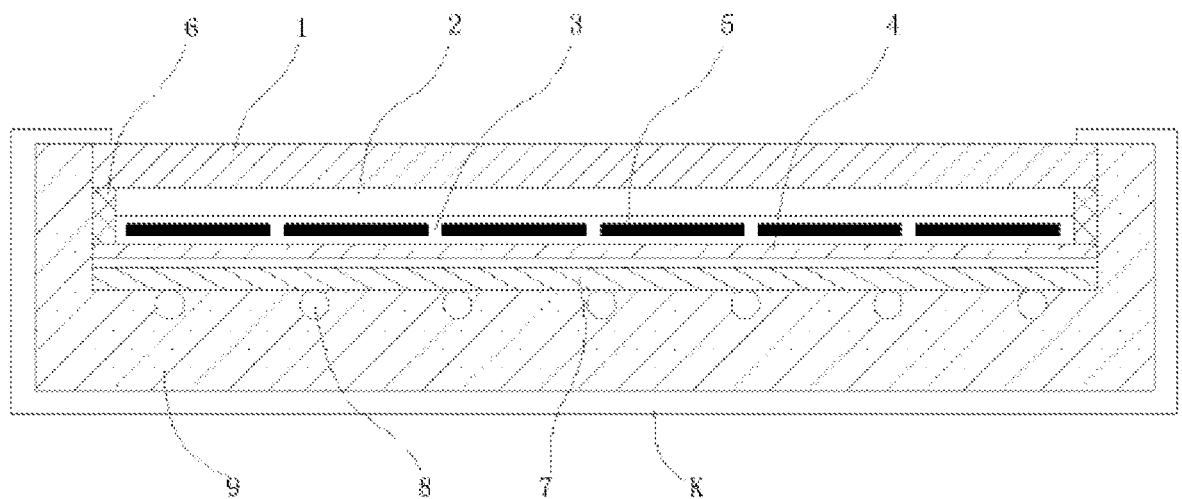
FIG. 4 is a sectional schematic diagram of the integrated photovoltaic/photo-thermal module including the photovoltaic module as shown in FIG. 3 according to a preferred embodiment of the disclosure.

The structure of the integrated photovoltaic/photo-thermal module including the photovoltaic module as shown in FIG. 3 according to a preferred embodiment of the disclosure is described below in combination with FIG. 4. As shown in FIG. 4, besides the above photovoltaic module, the integrated photovoltaic/photo-thermal module further includes a thermal collecting assembly, and the photovoltaic module is covered by the thermal collecting assembly at the bottom part and the side part, so as to collect the heat energy and use the heat energy. In at least one alternative embodiment, the thermal collecting assembly specifically includes: a thermal collecting plate 7 (or named as a thermal-conducting plate) located at the bottom side of the photovoltaic module (for example, adhered below the first back plate 4), a heat exchanger 8 contacting with the thermal collecting plate 7 (for example, installed on the thermal collecting plate 7), and a thermal insulation material 9 for realizing a covering function at the bottom part and the side part (for example, installed below the heat exchanger 8 and at the periphery of each of the above elements). Further in at least one alternative embodiment, the integrated photovoltaic/photo-thermal module may further includes a frame K, wherein the frame K is used for covering the outer side of the thermal insulation material 9, and used for encapsulating the above module.

An adhesive for adhering the thermal collecting plate 7 below the back plate 4 may be an EVA in at least one alternative embodiment, or adhesive materials such as a PVB. The thermal collecting plate or the thermal-conducting plate 7 uses a material with a good thermal collecting or thermal-conducting function, and in at least one alternative embodiment is further selected from black metals, so as to improve the thermal collecting capacity, such as black cadmium. The heat exchanger 8 uses a thermal-conducting copper pipe in at least one alternative embodiment, which is fixedly connected to the lower surface of the thermal collecting plate 7 in manners such as laser welding. The heat exchanger 8 may be an S-shaped copper pipe, and through a combined manner of a main pipe and capillary pipes, thereby increasing the thermal-conducting contact area, and improving the heat exchange capacity. The thermal insulation material 9, such as a thermal insulation foaming material in at least one alternative embodiment, may be filled between the clearances of the pipes forming the heat exchanger 8 and the peripheral positions of the front glass plate 1, the support structure 6, the back plate 4 and the thermal collecting plate 7, so as to achieve the good thermal insulation effect. The frame K is a metal frame in at least one alternative embodiment, and further in at least one alternative embodiment is made of aluminum or aluminum alloy. The outer surface of the thermal insulation material 9 and the outer edge position of the front glass plate 1 are covered by the frame K, and the frame K is used for protecting each element in the integrated photovoltaic/photo-thermal module.

Figure 6:
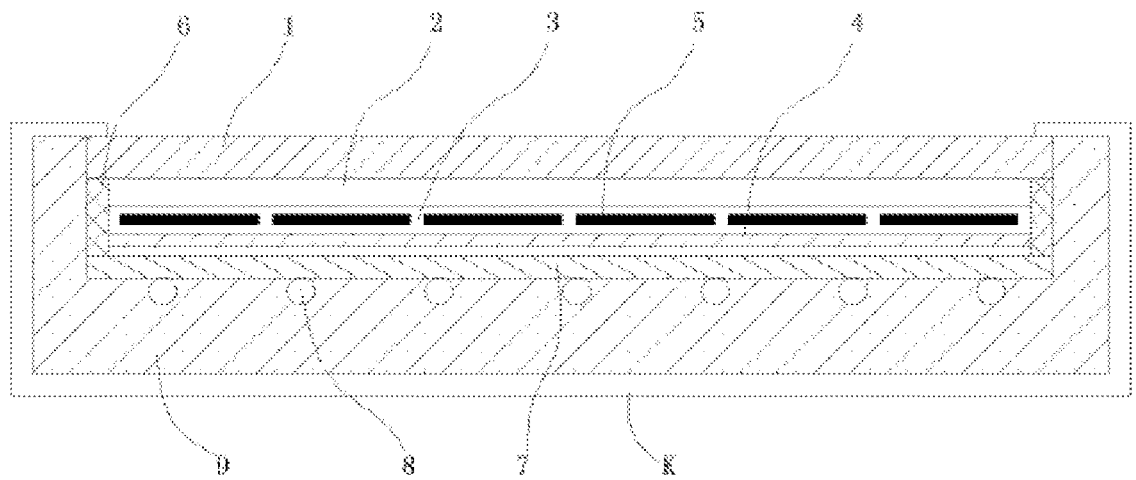
FIG. 6 is a sectional schematic diagram of the integrated photovoltaic/photo-thermal module including the photovoltaic module as shown in FIG. 5 according to another preferred embodiment of the disclosure.

The structure of the integrated photovoltaic/photo-thermal module including the photovoltaic module as shown in FIG. 5 according to another preferred embodiment of the disclosure is described in FIG. 6. As shown in FIG. 6, besides the above photovoltaic module, the integrated photovoltaic/photo-thermal module further includes a thermal collecting assembly, and the photovoltaic module is covered by the thermal collecting assembly at the bottom part and the side part. In the embodiment, because the photovoltaic module includes a second back plate 7, while the photovoltaic module is used in the integrated photovoltaic/photo-thermal module, the second back plate 7 may be manufactured by using a thermal collecting or thermal-conducting material, such that the second back plate 7 may be used as a thermal collecting plate or a thermal-conducting plate. In this circumstance, in at least one alternative embodiment, the thermal collecting assembly does not need to include the thermal collecting plate, but only include a heat exchanger 8 contacting with (for example, installed on the thermal collecting plate 7) the second back plate 7 (namely the thermal collecting plate or the thermal-conducting plate), and a thermal insulation material 9 for realizing a covering function (for example, installed below the heat exchanger 8 and at the periphery of each of the above elements) at the bottom part and the side part. Similarly, the integrated photovoltaic/photo-thermal module may further include a frame K also, wherein the frame K is used for covering the outer side of the thermal insulation material 9, and used for encapsulating the above assembly.

Figure 7:
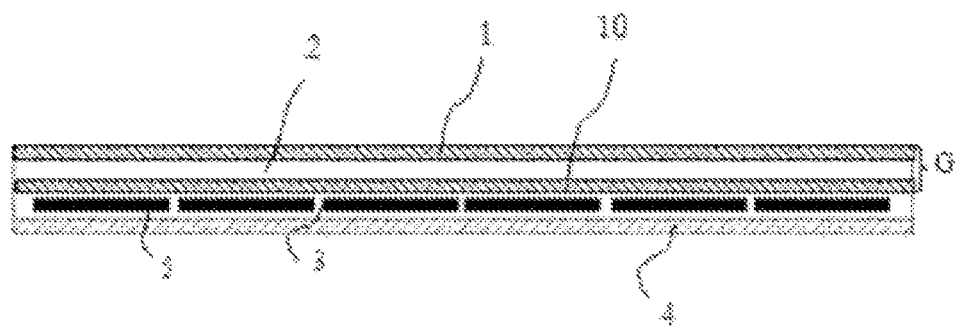
FIG. 7 is a sectional structure diagram of the photovoltaic module according to yet another preferred embodiment of the disclosure.

In another embodiment, as shown in FIG. 7, in order to obtain the hollow layer 2 in the photovoltaic module, a second glass 10 may further be included between the front glass plate 1 and the adhesive layer 3, the second glass 10 contacts with the adhesive layer 3, and two sides of the hollow layer 2 are the front glass plate 1 and the second glass 10 respectively. The hollow layer is installed between two layers of the glass, so it is relatively easy in both the supporting aspect and the sealing aspect, so the installation of the adhesive layer and the cell sheet and the like may not be affected.

Specifically, a vacuum glass assembly may be formed by the front glass plate 1 and the second glass 10 in advance. Namely, the existing vacuum glass assembly G may be used for replacing the front glass plate 11 in the conventional semi-finished photovoltaic module as shown in FIG. 1 in the prior art. Except that the front glass plate 11 is replaced by using the vacuum glass assembly G, the rest structure of the photovoltaic module is the same as the structure of the conventional semi-finished photovoltaic module as shown in FIG. 1. Namely, except the vacuum glass assembly G, the photovoltaic module further includes an adhesive layer 3 and a first back plate 4, the cell sheet 5 are clamped between the vacuum glass assembly G and the first back plate 4, and the vacuum glass assembly G, the cell sheets 5 and the first back plate 4 are adhered together by the adhesive layer 3. For the photovoltaic module in such structure, because the vacuum thermal insulation layer is provided, the good thermal insulation function is achieved. At the same time, compared with the photovoltaic module in the prior art, the structure has the beneficial effect of being more stable and reliable. In addition, because a vacuum glass technology is mature relatively, a vacuum glass assembly is directly used such that the photovoltaic module further has the advantages of low cost, reliable quality and the like.

Further, while the photovoltaic module with the above structure is applied to the integrated photovoltaic/photo-thermal module, the structure as shown in FIG. 4 may be referenced, namely, the structure includes a thermal collecting plate 7 adhered below a first back plate 4 by using an adhesive, a heat exchanger 8 fixed on the thermal collecting plate 7, and a thermal insulation material 9 installed below the heat exchanger 8 and the periphery of each of the above elements, and further includes a frame K, used for covering the outer side of the thermal insulation material 9, and encapsulating each of the above elements. Because the structure is the same as the structure as shown in FIG. 4, it is not graphically expressed and elaborated one by one herein.

Manufacturing methods for the photovoltaic module according to the disclosure and the integrated photovoltaic/photo-thermal module including the photovoltaic module are described below.

On one hand, the manufacturing method for the photovoltaic module includes: a first back plate is installed; an adhesive layer and a cell sheet are installed on the first back plate; and a front glass plate is placed above the adhesive layer, such that at least a hollow layer is further included between the front glass plate and the adhesive layer. It is explained below one by one.

S1: an adhesive layer 3 and a cell sheet 5 are installed on the first back plate 4.

Specifically, the first back plate 4 is successively coated with the adhesive layer 3 and adhered with the cell sheet 5, such that the cell sheet 5 are adhered to the first back plate 4 by using the adhesive layer. The adhesive layer 3 is in at least one alternative embodiment selected from an EVA material or a PVB material as above. The first back plate 4 is a TPT back plate in at least one alternative embodiment, and may be a TPE back plate or a FPF back plate.

S2: a front glass plate 1 is placed above the adhesive layer, such that a hollow layer 2 is formed between the front glass plate 1 and the adhesive layer 3.

Specifically, in an embodiment, a support structure 6 may be installed for supporting the front glass plate 1, so as to obtain the hollow layer 2. For example, the support structure 6 may be installed at two end positions or the whole peripheral position between the first back plate 4 and the front glass plate 1, and each connecting surface is sealed, such that the hollow layer may be formed between the adhesive layer 3 and the front glass plate 1. Also, the support structure is not limited to this, only if the necessary hollow layer 2 may be formed between the front glass plate 1 and the adhesive layer 3. In another embodiment, the support structure 6 may also be installed at two end positions or the whole peripheral position between the adhesive layer 3 and the front glass plate 1, at this moment, the height of the support structure 6 is equal to the thickness of the hollow layer 2.

Specifically, as a semi-finished product of the integrated photovoltaic/photo-thermal module, the photovoltaic module further includes a second back plate, the second back plate may be used as a thermal collecting plate at the same time in at least one alternative embodiment, in another embodiment, the support structure may also be formed on the second back plate, or a thermal collecting plate with the support structure may be used.

In at least one alternative embodiment, the hollow layer 2 is a vacuum layer or a gas layer filled with gases, such as nitrogen. The support structure 6 uses a material with the strength by which the front glass plate 1 may be supported, for example, an aluminum alloy, and engineering plastics (ABS plastics) with high mechanical strength. In addition, in order to improve the leakproofness, each connecting surface (for example, between the front glass plate 1 and the support structure 6) at the periphery of the hollow layer may be sealed by using sealing silica gel and the like. In this circumstance, the step of placing the front glass plate 1 cannot be operated in the air, instead, it may be operated in vacuum or an environment (for example, a nitrogen atmosphere or an inert gas atmosphere) filled correspondingly with a gas, or may be operated in the air environment with the very low humidity, for preventing water vapor from corroding the internal materials.

On the other hand, the above-mentioned manufacturing method for the integrated photovoltaic/photo-thermal module includes: firstly the photovoltaic module is formed; then a thermal collecting assembly is formed at the bottom part and the side part of the photovoltaic module; and further in at least one alternative embodiment, a frame is installed. Specifically, the step of forming a thermal collecting assembly includes steps of installing the thermal collecting plate (or a second back plate is directly used as the thermal collecting plate) at the bottom part of the photovoltaic module, and installing a heat exchanger below the thermal collecting plate and coating the outer side by a thermal insulation material. It is explained below one by one.

S3: a thermal collecting assembly is formed at the bottom part and the side part of the photovoltaic module.

In a preferred embodiment, the step of forming the thermal collecting assembly specifically includes:

S31: a thermal collecting plate 7 is installed at the bottom part of the photovoltaic module (for example, the thermal collecting plate and the photovoltaic module are adhered together); or, in the case of the presence of a second back plate, the second back plate is used as a thermal collecting plate. Namely, the thermal collecting plate 7 is located below a first back plate 4 in any case.

An adhesive by which the thermal collecting plate 7 is adhered below the first back plate 4 is an EVA in at least one alternative embodiment, or selected from adhesive materials such as PVB. The thermal collecting plate 7 uses a material with a good thermal collecting function, and in at least one alternative embodiment is further selected from black metals, so as to improve the thermal collecting capacity, for example, black cadmium.

S32: a heat exchanger 8 is installed on the thermal collecting plate 7 formed at the lower side of the first back plate 4.

In some embodiments, the heat exchanger 8 uses a thermal-conducting copper pipe, and is fixedly connected to the lower surface of the thermal collecting plate 7 in manners such as laser welding. The heat exchanger 8 may be an S-shaped copper pipe, and through a combined manner of a main pipe and capillary pipes, thereby the thermal conducting contact area is increased, the heat exchange capacity is improved.

S33: cover with the thermal insulation material 9.

The thermal insulation material 9 is in at least one alternative embodiment a thermal insulation foaming material, the thermal insulation material is adequately filled between clearances of pipes which is made up the heat exchanger 8 and the peripheral positions of the front glass plate 1, the support structure 6, the first back plate 4 and the thermal collecting plate 7, such that the good thermal insulation effect is achieved.

S4: the integrated photovoltaic/photo-thermal module is further in at least one alternative embodiment provided with a frame. The frame K is a metal frame in at least one alternative embodiment, and further in at least one alternative embodiment is made of aluminum or aluminum alloy. The outer surface of the thermal insulation material 9 and the outer edge position of the front glass plate 1 are covered by the frame K, and the frame K is used for protecting each element in the integrated photovoltaic/photo-thermal module. Then, the frame and the front glass plate are sealed for preventing water vapor from entering.

In addition, the manufacturing method for the integrated photovoltaic/photo-thermal module and the manufacturing method for the photovoltaic module may be simultaneously operated, for example, the method may include: a second back plate with a support structure is provided, and a first back plate, an adhesive layer and a cell sheet are successively laid on the second back plate for laminating; after laminating, the front glass plate is placed on the support structure, such that the front glass plate is separated from the adhesive layer in a determined distance so as to form a hollow layer, to obtain the photovoltaic module with the hollow layer; a heat exchanger is installed at the lower side of the second back plate; and the lower side of the heat exchanger and the side part of the photovoltaic module is covered with a thermal insulation material; and further in at least one alternative embodiment, a frame is installed.

The photovoltaic module, the integrated photovoltaic/photo-thermal module and the manufacture method thereof according to the disclosure are described in combination with the above drawings. The hollow layer is applied to the photovoltaic module and the integrated photovoltaic/photo-thermal module, so the integrated photovoltaic/photo-thermal module itself has a partial heat insulation function without the need to add a front glass blocking plate and a hollow heat insulation layer directly in front of the light-receiving surface of the assembly, thereby simplifying the structure and manufacturing process of the integrated photovoltaic/photo-thermal module.

Specifically, while the photovoltaic module only includes the front glass plate (namely, does not include the second glass), compared with the integrated photovoltaic/photo-thermal module in the prior art, because a layer of the front glass blocking plate is reduced, the refractive index changes are reduced in a route in which light is emitted to the assembly, so the light transmissivity is improved, the conversion efficiency is further improved, and the production cost of products is reduced.

In conclusion, it should be easily understood by those skilled in the art that the above beneficial manners may be freely combined and superposed in the precondition without confliction.

The above are merely the embodiments of the disclosure, and are not intended to limit the disclosure. Various modifications and changes of the disclosure may be made by those skilled in the art. Any modifications, equivalent replacements and improvements and the like made in the spirit and principle of the disclosure shall fall within the scope of the claims of the disclosure.

What is claimed is:

1. An integrated photovoltaic/photo-thermal module, comprising:
   a front glass plate, a first back plate, an adhesive layer provided between the front glass plate and the first back plate, and a cell sheet provided in the adhesive layer, wherein at least a hollow layer is provided between the front glass plate and the adhesive layer, and a top side of the front glass plate is a light-receiving surface;
   a support structure, wherein the front glass plate is supported on the support structure, such that the front glass plate is separated from the adhesive layer in a determined distance so as to form the hollow layer;
   a second back plate provided at a bottom side of the first back plate, wherein the support structure is supported on the second back plate and the support structure directly contacts with the second back plate, and the support structure surrounds an outside of the first back plate and the adhesive layer;
   wherein the second back plate is a thermal collecting plate;
   a thermal insulation material covering a lower side of the second back plate, and a side of the support structure; and
   a frame covering an outer side of the thermal insulation material.

2. The integrated photovoltaic/photo-thermal module as claimed in claim 1, wherein the hollow layer is vacuum or filled with nitrogen.

3. The integrated photovoltaic/photo-thermal module as claimed in claim 1, further comprising a heat exchanger contacting with the second back plate.

4. The integrated photovoltaic/photo-thermal module as claimed in claim 3, wherein the heat exchanger is a thermal conducting copper pipe.

5. The integrated photovoltaic/photo-thermal module as claimed in claim 4, wherein the heat exchanger is fixed below the thermal collecting plate.

6. A manufacturing method for an integrated photovoltaic/photo-thermal module, comprising:
   installing a first back plate;
   installing an adhesive layer and a cell sheet on the first back plate, wherein the cell sheet is provided in the adhesive layer; and
   installing a front glass plate above the adhesive layer, such that a hollow layer is at least provided between the front glass plate and the adhesive layer, and a top side of the front glass plate is a light-receiving surface;
   installing a support structure, and placing the front glass plate on the support structure, such that the front glass plate is separated from the adhesive layer in a determined distance so as to form the hollow layer, wherein installing the support structure further comprises:
   supporting the support structure with a second back plate, installing the second back plate before installing the first back plate, and providing the first back plate on the second back plate; or
   before installing the first back plate, installing the second back plate with the support structure, and installing the first back plate on the second back plate, wherein the second back plate is a thermal collecting plate;
   installing a thermal insulation material covering a lower side of the second back plate, and a side of the support structure; and
   installing a frame covering an outer side of the thermal insulation material.

7. The method as claimed in claim 6, wherein the step of forming a thermal collecting assembly comprising installing a heat exchanger at the lower side of the thermal collecting plate.

8. The method as claimed in claim 7, wherein the heat exchanger is a thermal conducting copper pipe.

9. A manufacturing method for an integrated photovoltaic/photo-thermal module, comprising:
   providing a second back plate with a support structure, the second back plate is a thermal collecting plate, successively laying a first back plate, an adhesive layer and a cell sheet on the second back plate;
   placing a front glass plate on the support structure, such that the front glass plate is separated from the adhesive layer in a determined distance so as to form a hollow layer, and a top side of the front glass plate is a light-receiving surface;
   installing a heat exchanger at a lower side of the second back plate; and
   covering the lower side of the heat exchanger and a side part of the integrated photovoltaic/photo-thermal module by a thermal insulation material;
   wherein the thermal insulation material also covers the lower side of the second back plate, and a side of the support structure; and
   a frame covering an outer side of the thermal insulation material.

* * * * *